(12) United States Patent
Miki et al.

(10) Patent No.: US 9,426,912 B2
(45) Date of Patent: Aug. 23, 2016

(54) GASKET

(71) Applicant: NOK CORPORATION, Tokyo (JP)

(72) Inventors: Yohei Miki, Aso (JP); Jun Furubayashi, Aso (JP)

(73) Assignee: NOK CORPORATION (JP)

( * ) Notice: Subject to any disclaimer, the term of this patent is extended or adjusted under 35 U.S.C. 154(b) by 148 days.

(21) Appl. No.: 14/354,797

(22) PCT Filed: Dec. 26, 2012

(86) PCT No.: PCT/JP2012/083597
§ 371 (c)(1),
(2) Date: Apr. 28, 2014

(87) PCT Pub. No.: WO2013/153715
PCT Pub. Date: Oct. 17, 2013

(65) Prior Publication Data
US 2014/0291940 A1  Oct. 2, 2014

(30) Foreign Application Priority Data

Apr. 12, 2012  (JP) .................................. 2012-090857

(51) Int. Cl.
*H05K 5/06* (2006.01)
*F16J 15/02* (2006.01)
(Continued)

(52) U.S. Cl.
CPC ................ *H05K 5/06* (2013.01); *F16J 15/025* (2013.01); *F16J 15/104* (2013.01); *H05K 5/061* (2013.01); *B65D 53/02* (2013.01); *F16J 15/062* (2013.01)

(58) Field of Classification Search
CPC ....... F16J 15/022; F16J 15/024; F16J 15/025; F16J 15/028; F16J 15/061; F16J 15/062; F16J 15/104; B65D 53/02; H05K 5/061
See application file for complete search history.

(56) References Cited

U.S. PATENT DOCUMENTS 3,554,567 A    1/1971  Carroll et al.
5,112,065 A *  5/1992  Meyer ...................... B60J 10/08
                                                      220/240
(Continued)

FOREIGN PATENT DOCUMENTS

DE    20203372 U1    6/2002
JP    S60-192167 A   9/1985
(Continued)

OTHER PUBLICATIONS

Extended European Search Report for Application No. EP 12 874 358 dated Jul. 17, 2015 (7 pages).
(Continued)

*Primary Examiner* — Kristina Fulton
*Assistant Examiner* — Nicholas L Foster
(74) *Attorney, Agent, or Firm* — Harness, Dickey & Pierce, P.L.C.

(57) ABSTRACT

A gasket made of a rubber-like elastic material is mounted in a mounting groove provided in one of two opposing members and is gripped between the one member and the other member so as to be in pressure contact with the two members. The gasket includes: a body section inserted in the mounting groove; one support protrusion provided on one side of the body section so as to be located on the side of the body section, and mounted in a deep groove provided on the bottom; the other support protrusion extending in a tilted manner from the other end side, in the width direction, of the body section toward the bottom in the direction away from the one support protrusion; and a lip ridge protrusion provided on the side of the body section, and located so that the tip thereof does not overlap the one support protrusion.

10 Claims, 4 Drawing Sheets

(51) Int. Cl.
*B65D 53/02* (2006.01)
*F16J 15/10* (2006.01)
*F16J 15/06* (2006.01)

(56) References Cited

U.S. PATENT DOCUMENTS

| | | | | |
|---|---|---|---|---|
| 6,354,601 | B1* | 3/2002 | Krampotich | H01L 21/67376 206/710 |
| 6,364,152 | B1* | 4/2002 | Poslinski | A47J 36/10 215/270 |
| 6,523,833 | B1 | 2/2003 | Ishigaki et al. | |
| 7,578,407 | B2* | 8/2009 | Tieben | H01L 21/37376 220/326 |
| 7,648,041 | B2* | 1/2010 | Ueda | H01L 21/67376 206/710 |
| 8,292,081 | B2* | 10/2012 | Sasaki | H01L 21/67376 206/710 |
| 8,720,693 | B2* | 5/2014 | Nagashima | H01L 21/67376 206/454 |
| 2002/0195455 | A1* | 12/2002 | Takahashi | B65D 53/02 220/806 |
| 2003/0106831 | A1* | 6/2003 | Eggum | F16J 15/025 206/711 |
| 2006/0081635 | A1* | 4/2006 | Matsutori | F16J 15/025 220/378 |
| 2009/0261533 | A1 | 10/2009 | Inoue | |
| 2013/0207352 | A1* | 8/2013 | Furubayashi | F16J 15/025 277/641 |

FOREIGN PATENT DOCUMENTS

| | | |
|---|---|---|
| JP | S62-108661 U | 7/1987 |
| JP | S63-092712 U | 6/1988 |
| JP | 04-258573 A | 9/1992 |
| JP | 2000-356267 A | 12/2000 |
| JP | 2004-039341 A | 2/2004 |
| JP | 2004-204941 A | 7/2004 |
| JP | 2007-255671 A | 10/2007 |
| WO | WO-2009/107495 A1 | 9/2009 |
| WO | WO-2012-056768 A1 | 5/2012 |

OTHER PUBLICATIONS

Chinese Search Report for the corresponding Chinese Application No. 201280070161.7 issued on Jul. 28, 2015 (1 page).

* cited by examiner

GASKET

CROSS-REFERENCE TO RELATED APPLICATIONS

This application is a U.S. National Stage Application of International Application No. PCT/JP2012/083597 filed on Dec. 26, 2012, and published in Japanese as WO 2013/153715 A1 on Oct. 17, 2013. This application claims priority to Japanese Application No. 2012-090857 filed on Apr. 12, 2012. The disclosures of the above applications are incorporated herein by reference.

BACKGROUND OF THE INVENTION

1. Field of the Invention

The present invention relates to a gasket.

More particularly, the present invention relates to a gasket for a case, which is made of a low rigidity material such as synthetic resins, aluminum or the like, and is used for electronic apparatuses or the like.

2. Description of the Conventional Art

In a case cover for electronic apparatuses or the like, which is made of a low rigidity material such as synthetic resins or the like, a gasket having a low reaction force and having a low change rate of the reaction force to the compression amount has been conventionally, mainly used. The gasket has been adopted from the viewpoint of preventing deformation of a cover and securing sealing ability to the variation of dimensional accuracy (following the partial variation of the compression amount) at the time of fastening.

As a kind of the gasket, the following gasket illustrated in FIG. 5 has been known (Japanese Utility Model Laid-Open No. 62-108661). The gasket includes a body section 310 which is inserted in a mounting groove not illustrated, two lines of support protrusions 320 and 330, which are provided on the bottom side of the mounting groove of the body section 310 and extend in parallel with the body section 310, and a lip ridge protrusion 340 which is provided on the other side of the body section 310.

Further, the gasket includes an aperture 350 formed so as to have a shape capable of absorbing the compression of a rubber-like elastic material, on the bottom side of a mounting groove on the surface opposed to the lip ridge protrusion 340.

However, even having the aforementioned shape, the gasket 300 is not a satisfactory gasket for low reaction force with respect to a case, which is made of a low rigidity material such as synthetic resins, aluminum or the like and is used for electronic apparatuses or the like.

Then, a gasket 300 having a shape illustrated in FIG. 6 has been proposed (Japanese Patent Application Laid-Open No. 2004-39341).

Namely, the gasket 300 is constituted with a body section 310 inserted in a mounting groove 100 of a case (one member) 100, and a lip ridge protrusion 340 provided on another side of the body section 310. The lip ridge protrusion 340 has a shape extending in a tilted manner toward the body section 310.

Therefore, as illustrated in FIG. 7, it can be expected to realize low reaction force of the lip ridge protrusion 340 and improve its followability at the time of gripping the lip ridge protrusion 340 between one member 100 and the other member 200 so as to be in pressure contact with the two members.

However, as for such the lip ridge protrusion 340 having a structure in a tilted manner, when the gasket 300 is formed and released, the lip ridge protrusion 340 is removed forcibly. Therefore, if the lip ridge protrusion 340 has a steeply tilted shape, there are problems that the lip ridge protrusion 340 is damaged easily so that the operability is low, or the like.

On the other hand, if the tilted angle of the lip ridge protrusion 340 is small, low reaction force is hardly made even if the lip ridge protrusion 340 falls, and the change of reaction force to the compression amount increases. In addition, the lip ridge protrusion 340 to hardly falls in the fixed direction as planned, and there is a possibility that the lip ridge protrusion 340 may partially fall in the opposite direction. As a result, lowering the sealing ability is caused.

DISCLOSURE OF THE INVENTION

Problems to be Solved by the Invention

The purpose of the present invention is to provide a gasket which can be easily formed, can be compressed largely at low reaction force, and is highly reliable.

Means for Solving the Problem

According to an aspect of the present invention, a gasket made of a rubber-like elastic material is mounted in a mounting groove provided in one of two opposing members and is gripped between the one member and the other member so as to be in pressure contact with the two members. The gasket is provided with: a body section which is inserted in the mounting groove; one support protrusion, which is provided on one end side of the body section in the width direction so as to be located on the bottom side of the mounting groove, and is mounted in a deep groove provided in a part of the bottom; the other support protrusion which extends in a tilted manner from the other end side, in the width direction, of the body section toward the bottom in the direction away from the one support protrusion; and a lip ridge protrusion, which is provided on the side of the body section which faces the other member, and is located so that the tip thereof does not overlap the one support protrusion of the body section. In a step when the gasket is inserted, the body section is displaced so as to tilt on the other support protrusion side using the one support protrusion as a fulcrum.

Effectiveness of the Invention

The present invention has the effects described below.

According to a gasket of the invention described in the first aspect of the present disclosure, the gasket can be easily formed, can be easily formed, can be compressed largely at low reaction force, and is highly reliable.

Further, according to a gasket of the invention described in the second aspect of the present disclosure, the gasket can be compressed largely at low reaction force, and attitude stability of the gasket after being inserted is proper.

Further, according to a gasket of the invention described in the third aspect of the present disclosure, the gasket can be easily, certainly mounted in the mounting groove.

Further, according to a gasket of the invention described in the fourth aspect of the present disclosure, since the lip ridge protrusion constantly falls in the fixed direction as planned, reliability of the sealing ability can increase.

Further, according to a gasket of the invention described in the fifth aspect of the present disclosure, the gasket can be easily inserted in the mounting groove, and it can be prevented more certainly that the gasket falls on the inner peripheral side of the mounting groove.

Furthermore, according to a gasket of the invention described in the sixth aspect of the present disclosure, the gasket can be compressed largely by further lower reaction force and is further highly reliable.

PREFERRED EMBODIMENTS FOR CARRYING OUT OF THE INVENTION

Preferred embodiments for carrying out of the present invention will be described below.

Figure 1:
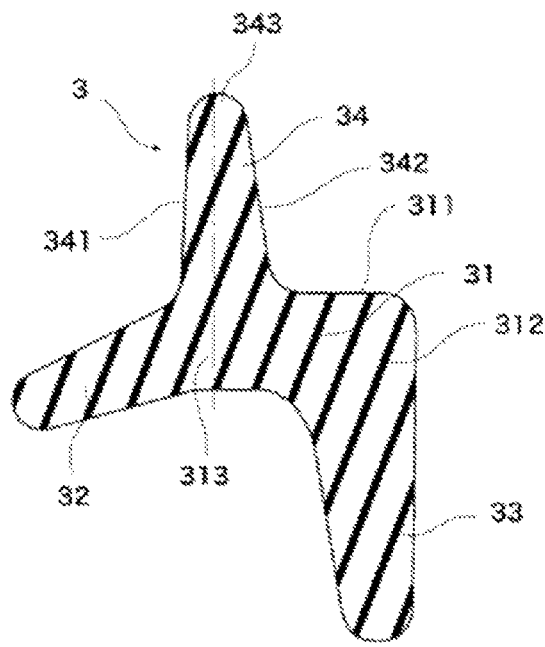
FIG. 1 is a cross-sectional view of a gasket according a first embodiment of the present invention
Figure 2:
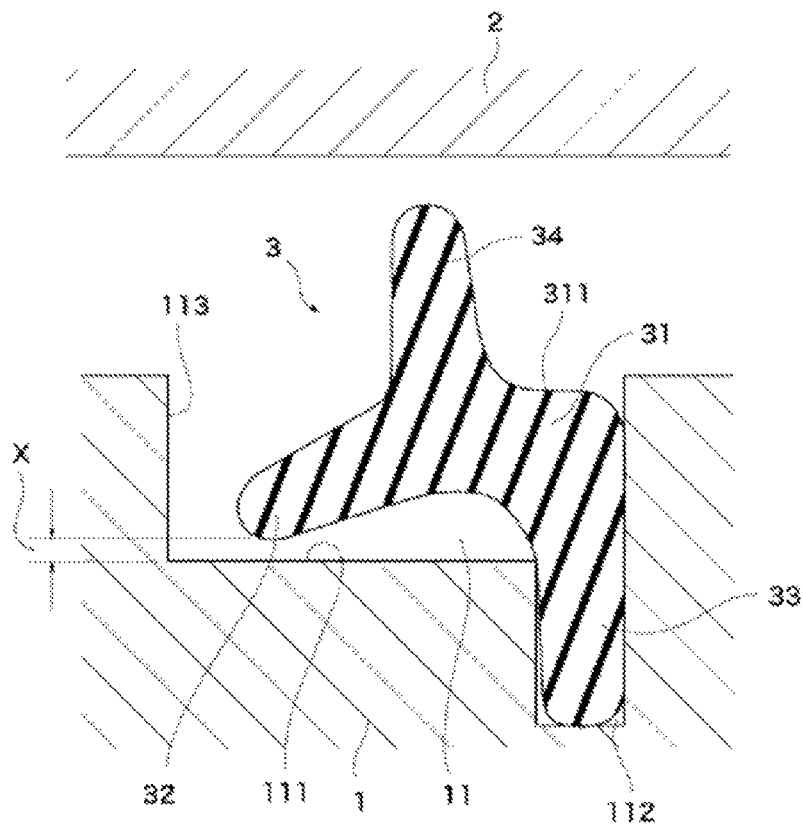
FIG. 2 is a cross-sectional view of a state that the gasket in FIG. 1 is inserted in a mounting groove
Figure 3:
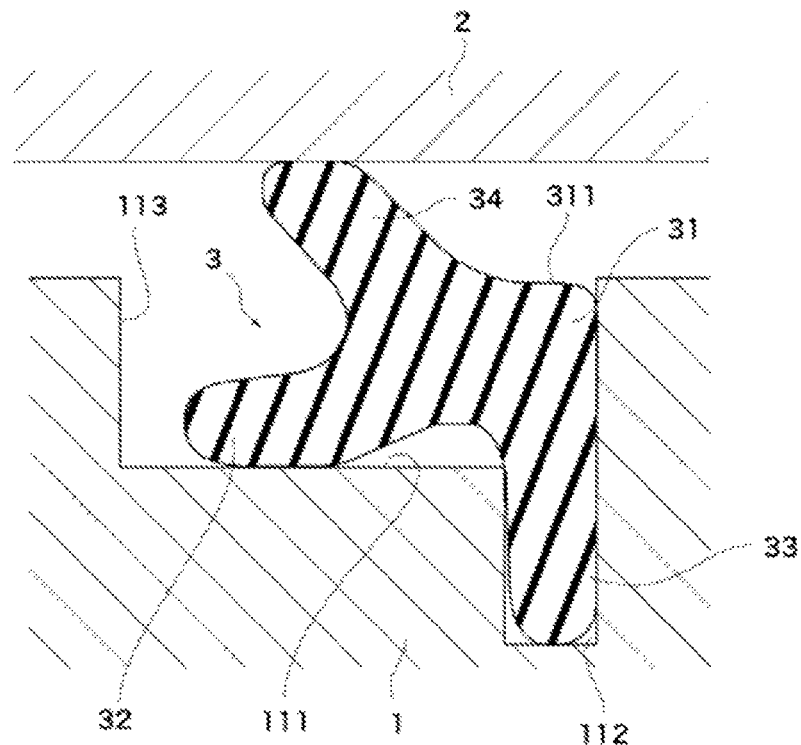
FIG. 3 is a cross-sectional view of a state that the other member is assembled to FIG. 2 and the gasket is gripped in pressure contact

A gasket as a first embodiment according to the present invention is a gasket 3 made of a rubber-like elastic material. As illustrated in FIGS. 1, 2 and 3, the gasket 3 is mounted in a mounting groove 11 provided in one of two opposing members 1 and 2 and is gripped between the one member 1 and the other member 2 so as to be in pressure contact with the two members 1 and 2.

Further, the gasket 3 is provided with: a body section 31 which is inserted in the mounting groove 11; one support protrusion 33, which is provided on one end side 312 of the body section 31 in the width direction so as to be located on the bottom 111 side of the mounting groove 11, and is mounted in a deep groove 112 provided in a part of the bottom 111; the other support protrusion 32 which extends in a tilted manner from the other end side 313, in the width direction, of the body section 31 toward the bottom 111 in the direction away from the one support protrusion 33; a lip ridge protrusion 34 being provided on the side of the body section 31 facing the other member 2, and being located so that the tip 343 thereof does not overlap the one support protrusion 33 of the body section 31.

The tilted angle of the other support protrusion 32 with respect to the bottom 111 is within a range from 15 to 45 degrees. If the tilted angle is smaller than 15 degrees, a proper sealing surface pressure cannot be obtained. If the tilted angle is larger than 45 degrees, the other support protrusion 32 is removed forcibly at the time of forming and releasing. Therefore, if the other support protrusion 32 has a steeply tilted shape, there are problems that the other support protrusion 32 is damaged easily so that the operability is low, or the like.

Further, the lip ridge portion 34 is formed so as to be upright to the bottom 111.

Further, in a state of assembling the gasket 3, as illustrated in FIG. 3, the body section 31 is the body section 31 is displaced so as to tilt on the other support protrusion 32 side using the one support protrusion 33 as a fulcrum.

As mentioned above, the other support protrusion 32 has a shape extending from the other end side 313, in the width direction, of the body section 31 toward the bottom 111 in the direction away from the one support protrusion 33. As a result, when the lip ridge protrusion 34 is pressed by the other member 2, the lip ridge protrusion 34 is easily deformed as illustrated in FIG. 3. Therefore, the gasket can be easily formed, can be compressed largely at low reaction force, and is highly reliable.

Further, as illustrated in FIG. 3, the one support protrusion 33 stably holds the gasket 3 on the side of the one member 1, and the other support protrusion 32 contacts with the bottom 111 of the mounting groove 11 at a wide area. Therefore, proper sealing ability can be exerted.

Further, in the constitution of the present invention, an aperture X exists between the other support protrusion 32 and the bottom 111 in a stage before assembling the gasket 3, and the other support protrusion 32 contacts with the bottom 111 in a stage of assembling the gasket 3, as illustrated in FIG. 2. Therefore, the gasket can be compressed largely at low reaction force, and the attitude stability of the gasket after being assembled is proper.

Furthermore, the body section 31 includes a flat press surface 311 on the side facing the other member 2 in which the one support protrusion 33 is provided. Therefore, when the gasket 3 is mounted in the mounting groove 11, the press surface 311 is pressed by a jig, so that the gasket 3 can be mounted easily. In addition, the gasket 3 can be mounted certainly.

Further, as illustrated in FIG. 1, as for the angles of both of tilted surfaces 341 and 342, which form the lip ridge protrusion 34 of the gasket 3, the tilted surface 341 on the side of the other support protrusion 32 is steeper than the other tilted surface 342.

Therefore, the lip ridge protrusion 34 constantly falls in the fixed direction (on the left side in FIG. 1) as planned, so that the reliability of sealing ability can be more improved.

Further, as illustrated in FIG. 3, the gasket 3 is designed to have a length so that the tip of the other support protrusion 32 does not contact with a side surface 113 of the mounting groove 11, in the stage of assembling the gasket 3. As a result, displacing the other support protrusion 32 is not prevented by the side surface 113 of the mounting groove 11, so that gasket 3 can be compressed largely at low reaction force and is highly reliable.

A material used for a gasket 1 is a rubber-like elastic material.

As the rubber material, nitrile rubber, acrylic rubber, EPDM, CR, silicone rubber, fluoro-rubber, natural rubber or the like can be used, and the rubber material can be selected properly from the rubbers according to a use.

The strength of a rubber is preferably Hs 40 to Hs 60. It is important that the strength is smaller than Hs 70 so as to have low reaction force.

Figure 4:
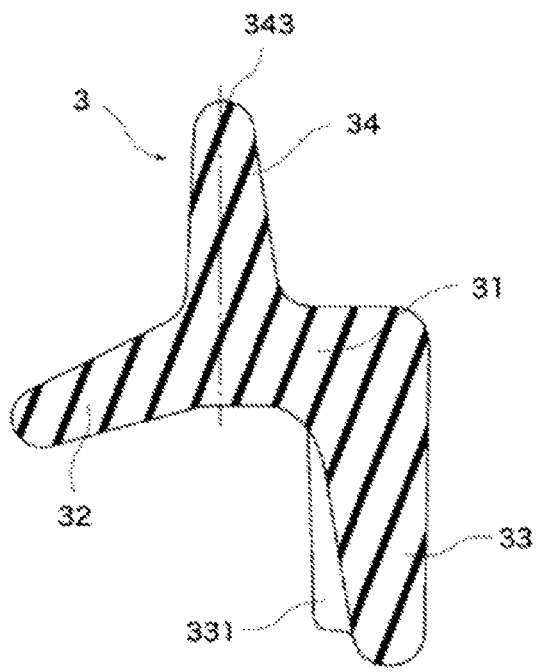
FIG. 4 is a view illustrating a second embodiment of the present invention, which is similar to FIG. 1
Figure 5:
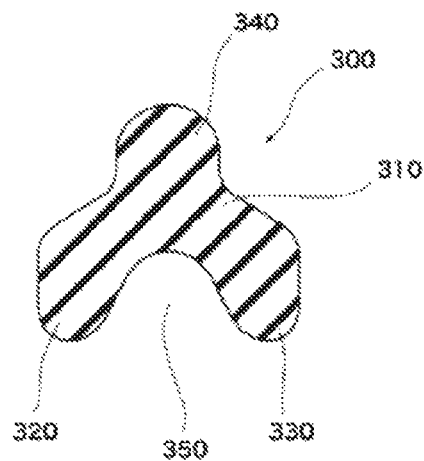
FIG. 5 is a cross-sectional view of a gasket according to a conventional technique
Figure 6:
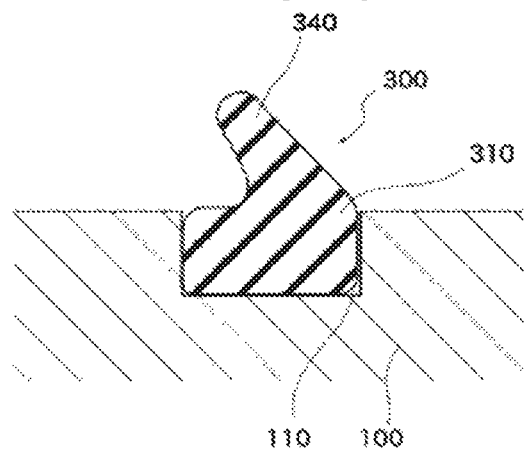
FIG. 6 is a cross-sectional view of the other gasket according to a conventional technique
Figure 7:
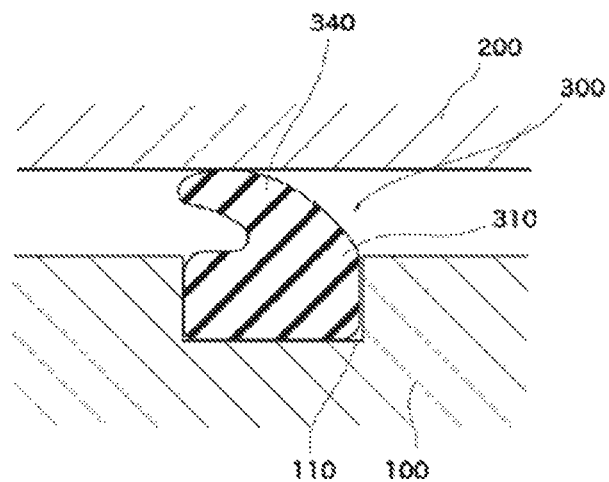
FIG. 7 is a cross-sectional view illustrating a state that the other member is assembled to FIG. 6 and the gasket is gripped in pressure contact

Then, the second embodiment of the present invention will be described below with reference to FIG. 4.

The point which is different from the first embodiment is the point that a holding protrusion 331 is provided on the peripheral surface of the one support protrusion 33.

The plural holding protrusions 331 are provided at equal intervals on the inner peripheral side (the left side in FIG. 4) of the one support protrusion 33.

Further, when the gasket 3 is inserted in the deep groove 112 of the mounting groove 11, the holding protrusion 331 contacts with the peripheral surface of the deep groove 112, so that the gasket 3 is assembled in a state of being gripped in pressure contact with the two members.

Therefore, according to the second embodiment of the present invention, insertion resistance of the gasket 3 to the mounting groove 11 can decrease. As a result, the gasket 3 can be easily inserted in the deep groove 112, and it can be prevented more certainly that the gasket 3 falls on the inner peripheral side of the mounting groove 11.

INDUSTRIAL APPLICABILITY

The gasket according to the present invention can be used as a gasket for a case, which is made of a low rigidity material such as synthetic resins, aluminum or the like and is used for electronic apparatuses or the like.

What is claimed is:

1. A gasket assembly comprising:
    a first member;
    a second member opposing the first member, the second member having a stepped mounting groove formed therein, the stepped mounting groove having:
        a first side surface;
        a second side surface facing the first side surface;
        a groove bottom surface extending from the first side surface toward the second side surface; and
        a slot extending further into said second member from said groove bottom surface and having a slot bottom surface;
    a gasket made of an elastomeric material, said gasket being mounted in said mounting groove and gripped between the first member and the second member so as to be in pressure contact with the first and second members,
    wherein the gasket includes:
        a body inserted in the mounting groove;
        a first support protrusion projecting from a first end of the body in a width direction of the body and nested within said slot provided in the groove bottom surface, a distal end of the first support protrusion abutting against the slot bottom surface; and
        a second support protrusion extending at a tilted angle from a second end of the body in the width direction, the second end of the body being opposite the first end of the body, the second support protrusion angling toward the groove bottom surface; and
        a lip ridge protrusion extending from a side of the body, the side of the body facing the first member, said lip ridge protrusion including a tip that is radially offset from the first support protrusion so that said tip does not overlap the first support protrusion, and
    wherein, in a pre-gripped state:
        said distal end of the first support protrusion is abuttingly engaged with the slot bottom surface;
        said tip of said lip ridge protrusion is spaced apart from said first member; and
        an entirety of said second support protrusion is spaced apart from said groove bottom surface;
    in a post-gripped state:
        said distal end of the first support protrusion is abuttingly engaged with the slot bottom surface;
        said tip of said lip ridge protrusion is abuttingly engaged with said first member; and
        said second support protrusion is abuttingly engaged with said groove bottom surface; and
    in a transitional state between said pre-gripped state and said post-gripped state, the body is displaced so as to tilt on a side of the second support protrusion around the first support protrusion, and the second support protrusion initiates contact with the groove bottom surface and is deformed.

2. The gasket according to claim 1,
wherein the body includes a flat press surface on a side of the body facing the second member, the flat press surface being connected to the first support protrusion.

3. The gasket according to claim 1,
wherein the lip ridge protrusion of the gasket is formed by first and second tilted surfaces and the first tilted surface nearer the second support protrusion is steeper than the second tilted surface.

4. The gasket according to claim 1,
wherein a holding protrusion is provided on a peripheral surface of the first support protrusion.

5. The gasket according to claim 1,
wherein the second support protrusion is spaced apart from the first side surface of the mounting groove, in said transitional state.

6. The gasket according to claim 2,
wherein the lip ridge protrusion of the gasket is formed by first and second tilted surfaces and the first tilted surface nearer the second support protrusion is steeper than the second tilted surface.

7. The gasket according to claim 2,
wherein a holding protrusion is provided on a peripheral surface of the first support protrusion.

8. The gasket according to claim 3,
wherein a holding protrusion is provided on a peripheral surface of the first support protrusion.

9. The gasket according to claim 2,
wherein the second support protrusion is spaced apart from the first side surface of the mounting groove, in said transitional state.

10. The gasket according to claim 3,
wherein the second support protrusion is spaced apart from the first side surface of the mounting groove, in said transitional state.

\* \* \* \* \*